(12) United States Patent
Kawabata (10) Patent No.: US 8,078,938 B2
(45) Date of Patent: Dec. 13, 2011

(54) SEMICONDUCTOR MEMORY, SEMICONDUCTOR MEMORY SYSTEM, AND ERROR CORRECTION METHOD FOR SEMICONDUCTOR MEMORY

(75) Inventor: Kuninori Kawabata, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 869 days.

(21) Appl. No.: 12/127,603

(22) Filed: May 27, 2008

(65) Prior Publication Data

US 2008/0301519 A1 Dec. 4, 2008

(30) Foreign Application Priority Data

May 30, 2007 (JP) ................. 2007-142956

(51) Int. Cl.
*G11C 29/00* (2006.01)
(52) U.S. Cl. ....................... 714/763; 714/800
(58) Field of Classification Search .................. 714/763, 714/800
See application file for complete search history.

(56) References Cited

U.S. PATENT DOCUMENTS

| 5,856,890 | A | * | 1/1999 | Hamai et al. | 360/53 |
| 7,299,401 | B2 | * | 11/2007 | Fukuda | 714/769 |
| 2002/0110071 | A1 | * | 8/2002 | Oki et al. | 369/59.24 |

FOREIGN PATENT DOCUMENTS

JP 2005-216437 A 8/2005

* cited by examiner

*Primary Examiner* — M. Mujtaba K Chaudry
(74) *Attorney, Agent, or Firm* — Arent Fox LLP (57) ABSTRACT

Aspects of the embodiment include providing a semiconductor memory comprising; a plurality of memory blocks that includes a plurality of regular memory cells; a plurality of first parity blocks that are disposed in accordance with the plurality of memory blocks, wherein the plurality of first parity blocks include a first parity memory cell holding a first parity code; a second parity block that includes a second parity memory cell holding a second parity code having a parity bit corresponding to the first parity code; a parity error correction unit that corrects an error of the first parity code using the second parity code; and a data error correction unit that corrects an error of the data stored in a regular memory cell using the first parity code corrected by the parity error correction unit.

20 Claims, 9 Drawing Sheets

SEMICONDUCTOR MEMORY, SEMICONDUCTOR MEMORY SYSTEM, AND ERROR CORRECTION METHOD FOR SEMICONDUCTOR MEMORY

CROSS-REFERENCE TO RELATED APPLICATIONS

This application claims the benefit of priority from Japanese Patent Application No. 2007-142956 filed on May 30, 2007, the entire contents of which are incorporated herein by reference.

BACKGROUND OF THE INVENTION

1. Field of the Invention

The present application relates to a semiconductor memory and a semiconductor memory system having an error correction function.

2. Description of Related Art

Recently, semiconductor memories including an error correction circuit for remedying a defective bit is mounted are proposed. In these semiconductor memories, when a ratio DN/PN of the number of bits DN of data and the number of bits PN of an error correction code (parity code) is larger, a memory cell area for storing the parity code (parity memory cell) is relatively reduced, whereby area efficiency is improved. On the contrary, in general, when the ratio DN/PN is increased, a remedy efficiency, which is the ratio 1/(DN+PN) of the number of bits of data to be remedied to the total number of bits, is reduced. That is, improvement of the area efficiency is in contradiction to improvement of the remedy efficiency. Japanese Laid-open Patent Publication No. 2005-216437, for example, discloses a method of correcting a data error using a horizontal/vertical parity code to improve both the area efficiency and the remedy efficiency.

Additional advantages and novel features of the invention will be set forth in part in the description that follows, and in part will become more apparent to those skilled in the art upon examination of the following or upon learning by practice of the invention.

SUMMARY

Aspects of an embodiment include providing a semiconductor memory comprising; a plurality of memory blocks that includes a plurality of regular memory cells; a plurality of first parity blocks that are disposed in accordance with the plurality of memory blocks, wherein the plurality of first parity blocks include a first parity memory cell holding a first parity code; a second parity block that includes a second parity memory cell holding a second parity code having a parity bit corresponding to the first parity code; a parity error correction unit that corrects an error of the first parity code using the second parity code; and a data error correction unit that corrects an error of the data stored in a regular memory cell using the first parity code corrected by the parity error correction unit.

DESCRIPTION OF PREFERRED EMBODIMENTS

In the drawings, double circles show external terminals. Signals supplied through the external terminals are denoted by the same symbols as the names of the terminals. Signal lines, through which the signals are transmitted, are denoted by the same symbols as the names of the signals. Signals having "/", attached to the leading ends thereof show a negative logic.

Figure 1:
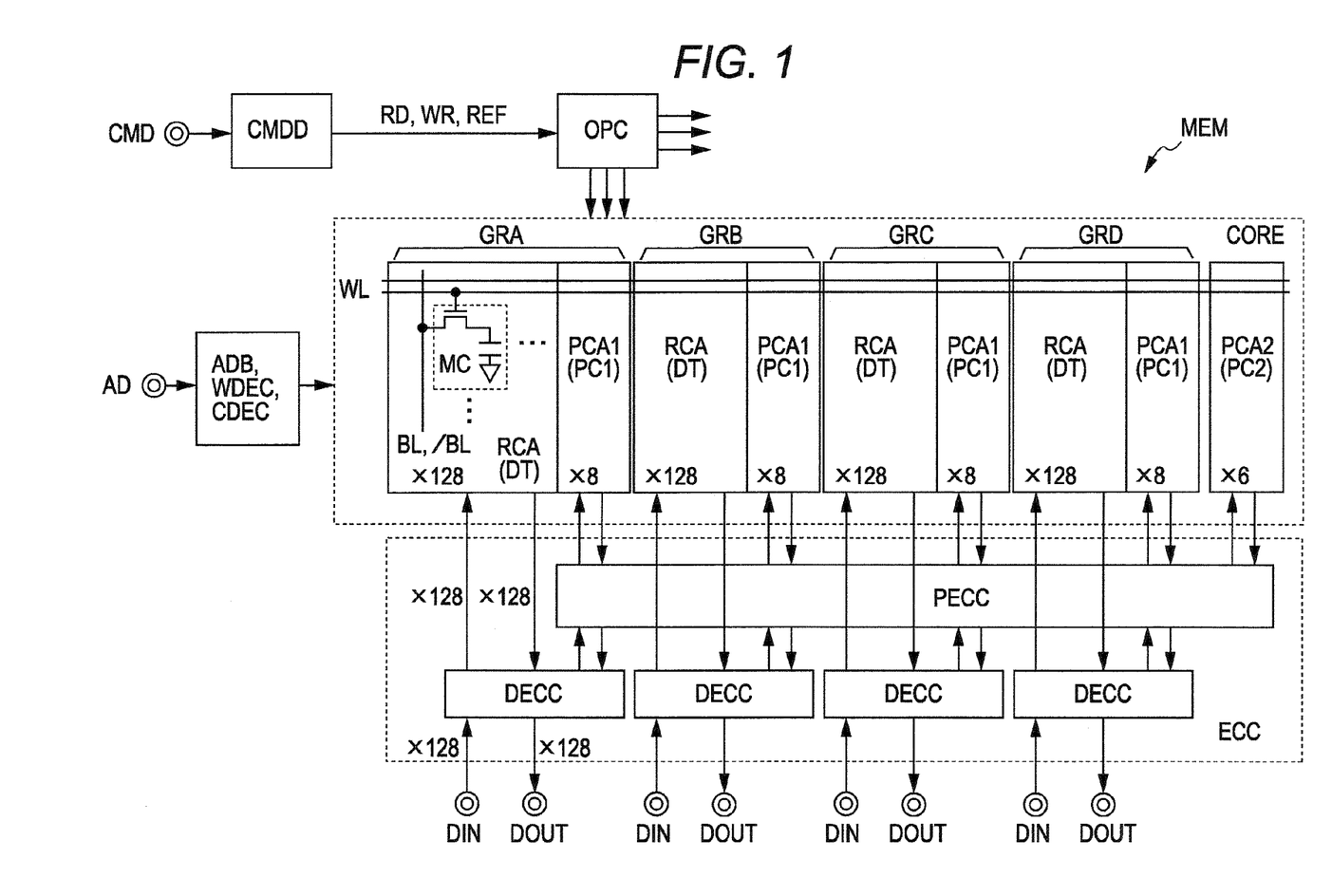
FIG. 1 shows a first exemplary implementation, in accordance with aspects of the embodiment.

FIG. 1 shows a first exemplary implementation, in accordance with aspects of the embodiment. A semiconductor memory MEM of FIG. 1 is, for example, a DRAM core (IP). The memory MEM includes a command decoder CMDD, an operation control circuit OPC, an address buffer ADB, a word decoder WDEC, a column decoder CDEC, a memory core CORE, an error correction unit ECC, and the like. Although a clock signal is not shown, the first exemplary implementation, in accordance with aspects of the embodiment can be applied to both a clock synchronization type semiconductor memory and a clock non-synchronization type semiconductor memory.

The command decoder CMDD receives command signals CMD (access requests) such as a chip select signal /CS, a row address strobe signal /RAS, a column address strobe signal /CAD, a write enable signal /WE, and the like. The command decoder CMDD has a command buffer, which is not shown, for receiving the command signal CMD. The command decoder CMDD decodes the received command signal CMD. Then, the command decoder CMDD outputs a read control signal RD for executing a read-out operation, a write control signal WR for executing a write operation, or a refresh control signal REF for executing a refresh operation. The operation control circuit OPC outputs a control signal and a timing signal to the memory core CORE, a data input/output circuit which is not shown, and the like in response to control the signals RD, WR, and REF. For example, the data input/output circuit is disposed between the error correction unit ECC and data terminals DIN and DOUT.

The address buffer ADB receives an address signal AD and outputs the received address signal AD to the word decoder WDEC. The word decoder WDEC decodes an address signal AD (row address) and outputs a word decode signal for selecting a word line WL. The column decoder CDEC decodes an address signal AD (column address) and outputs a column decode signal for selecting a plurality of sets of bit line pairs BL, /BL. In the first exemplary implementation, as the numbers of bits of regular data, which is input to and output from the memory core CORE, is larger than the numbers of bits of the data terminal DIN (or DOUT), the column decoder CDEC is provided. The column decoder CDEC may be omitted, for example when the number of bits of the regular data, which is input to or output from the memory core CORE, is equal to the number of bits of the data terminal DIN (or DOUT).

The memory core CORE includes four memory groups GRA, GRB, GRC, and GRD, each having a regular cell array RCA (memory block) and a first parity cell array PCA1 (first parity block) and a second parity cell array PCA2 (second parity block). Each of the regular cell array RCA, the parity cell array PCA1, and the parity cell array PCA2 has a sense amplifier and a precharge circuit that are not shown.

The parity cell arrays PCA1 and PCA2 have a structure similar to the regular cell arrays RCA, except for the number of the bit line pairs BL, /BL. That is, each parity cell array PCA1 includes a plurality of dynamic memory cells MC (first parity memory cells) disposed in a matrix state and eight sets of the bit line pairs BL, /BL. The parity cell array PCA2 includes a plurality of dynamic memory cells MC (second parity memory cells) disposed in a matrix state and six sets of the bit line pairs BL, /BL.

Each regular cell array RCA includes a plurality of dynamic memory cells MC (regular memory cell) disposed in a matrix state and 128 sets of bit line pairs BL, /BL coupled to the memory cells MC disposed in a longitudinal direction in the drawing. Each memory cell MC includes a capacitor for holding data as a charge and a transfer transistor for coupling one end of the capacitor to the bit line BL (or /BL). The other end of the capacitor is coupled to a precharge voltage line or an internal power supply line. The gates of the transfer transistors of the 128 memory cells MC of each regular cell array RCA disposed in a lateral direction of the drawing, the gates of the transfer transistors of the eight memory cells MC of the parity cell array PCA1 disposed in the lateral direction of the drawing, and the gates of the transfer transistors of the six memory cells MC of the parity cell array PCA2 disposed in the lateral direction of the drawing are connected to the common word line WL. The memory cell MC of the regular cell array RCA stores regular data DT supplied to a data input terminal DIN. That is, each regular cell array RCA outputs the 128-bit regular data DT by a single read-out operation and inputs the 128-bit regular data DT by a single write operation.

The memory cell MC of the parity cell array PCA1 stores a first parity code PC1 for correcting the error of the regular memory cell MC. The parity cell array PCA1 outputs the first parity code PC1 of 8 bits by a single read-out operation and inputs the first parity code PC1 of 8 bits by a single write operation.

The memory cell MC of the parity cell array PCA2 holds a second parity code PC2 for correcting the error of the first parity code held in the memory cell MC (first parity memory cell) of the parity cell array PCA1. The second parity code PC2 is a parity bit of 6 bits. The second parity code PC2 includes bits common to all the bits of the first parity code PC1 accessed by a single command. The parity cell array PCA2 outputs the second parity code PC2 of 6 bits by a single operation and inputs the second parity code PC2 of 6 bits by a single write operation.

The error correction unit ECC includes a parity error correction unit PECC common to the four parity cell arrays PCA1 and four data error correction units DECC corresponding to the memory groups GRA, GRB, GRC, and GRD, respectively. Each of the parity error correction unit PECC and the data error correction units DECC comprises, for example, a logic circuit (hardware).

In the write operation to the memory MEM, the parity error correction unit PECC generates the second parity code PC2 for correcting the first parity code PC1 using a single arithmetic operation using the first parity code PC1 generated by the data error correction units DECC. The second parity code PC2 is a code dedicated to the first parity code PC1 and does not include the logic of the regular data DT. In the read operation from the memory MEM, the parity error correction unit PECC detects and corrects the error of the first parity code PC1 held in the first parity memory cell MC using a single arithmetic operation using the second parity code PC2 held by the second parity memory cell MC.

Each data error correction unit DECC generates the first parity code PC1 for correcting the regular data DT using the written data (regular data DT) received in the data input terminal DIN in the write operation to the memory MEM. Each data error correction unit DECC detects and corrects the error of the regular data DT read from the regular memory cell MC using the first parity code PC1 corrected by the parity error correction circuit PECC in the read operation from the memory MEM.

The cell array RCA, the parity cell array PCA1, the parity cell array PCA2, the parity error correction unit PECC, and the data error correction units DECC, for example, are composed on one chip. The parity error correction unit PECC and the data error correction units DECC, for example, detect and correct an error using a hamming code.

The memory MEM of the first exemplary implementation, in accordance with aspects of the embodiment may be formed as, for example, SoC (System on Chip). The memory MEM does not have a redundant circuit (redundant memory cell, redundant word line, and redundant bit line) for remedying a defective memory cell and the like, a redundant fuse circuit for making a redundant circuit enable, or a redundant control circuit. Accordingly, the defective bit and the like of the memory cell MC are remedied by the error correction unit ECC. Note that the memory MEM may have both the redundant circuit and the redundant fuse circuit so that it can remedy the defective bit and the like of the memory cell MC by both the redundant circuit and the error correction unit ECC or by selecting any of the redundant circuit and the error correction unit ECC.

Figure 2:
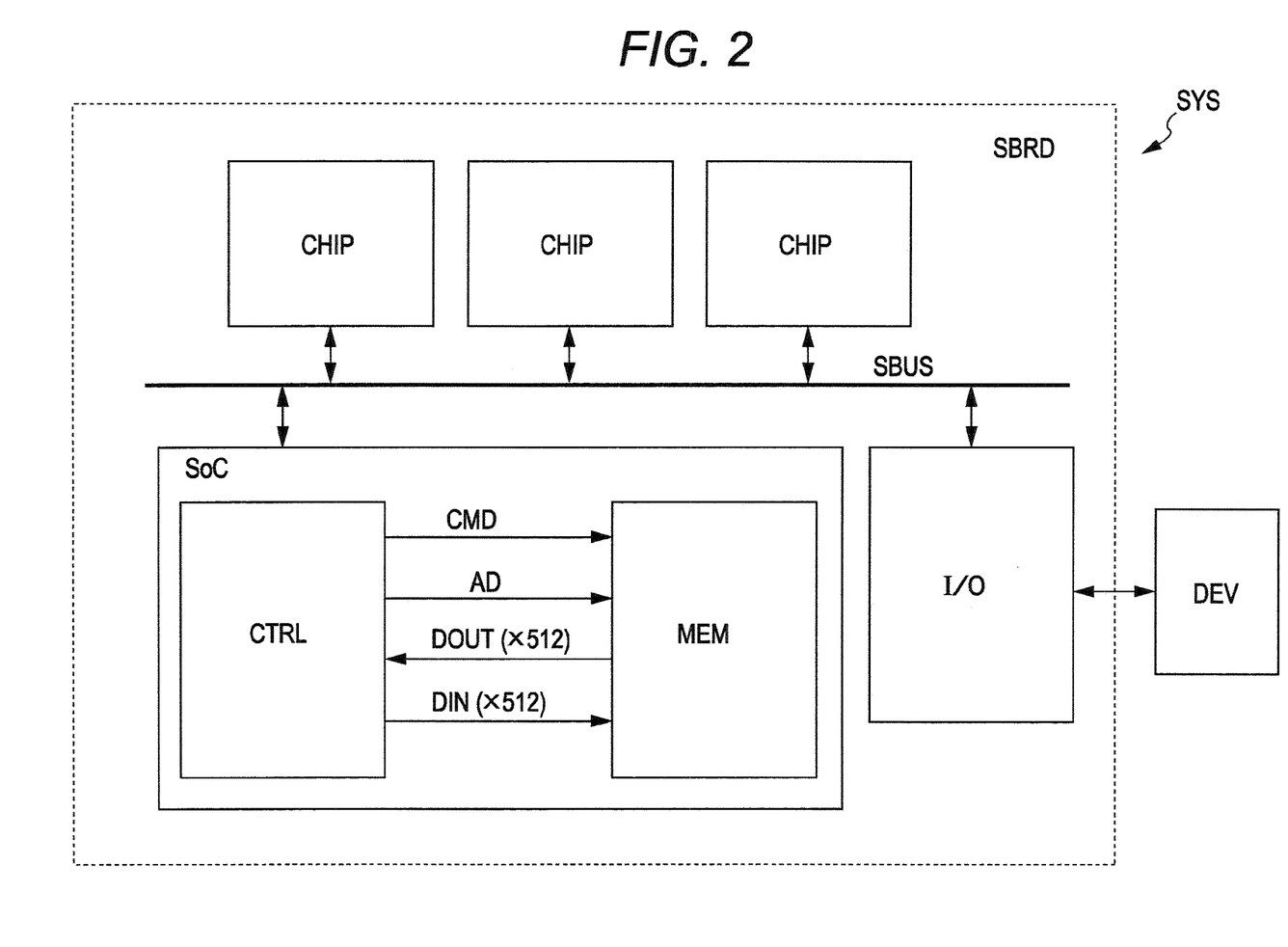
FIG. 2 shows a system block diagram including a memory of the first exemplary implementation, in accordance with aspects of the embodiment.

FIG. 2 shows a system SYS including the memory MEM shown in FIG. 1. The system SYS may be, for example, mobile equipment such as a mobile phone and the like. The system SYS is mounted on a system board SBRD and includes a plurality of semiconductor chips CHIP which are coupled to each other by a system bus SBUS, SoC, an external interface unit I/O of the system board SBRD, and a peripheral device DEV coupled to the external interface unit I/O. The semiconductor chips CHIP are, for example, CPU, DMAC, an image processing controller, and the like. The peripheral device DEV is, for example, a liquid crystal display, a speaker, an input device, and the like. Note that a non-volatile semiconductor memory such as a flash memory, and the like is mounted on the system board SBRD to store a program executed by the CPU.

The semiconductor chips SoC include the memory MEM shown in FIG. 1 and a controller CTRL for controlling the access operation to the memory MEM. The controller CTRL receives data of 512 bits from the memory MEM by a single read access and writes data of 512 bits to the memory MEM by a single write access. Note that the memory blocks, the first parity block, the second parity block, the parity error correction unit, and the data error correction unit may be composed on one chip. Otherwise, each of the memory blocks may be composed on one chip, the first parity block and the second parity block may be composed on one chip, and the parity error correction unit and the data error correction unit may be composed on one chip.

Figure 3:
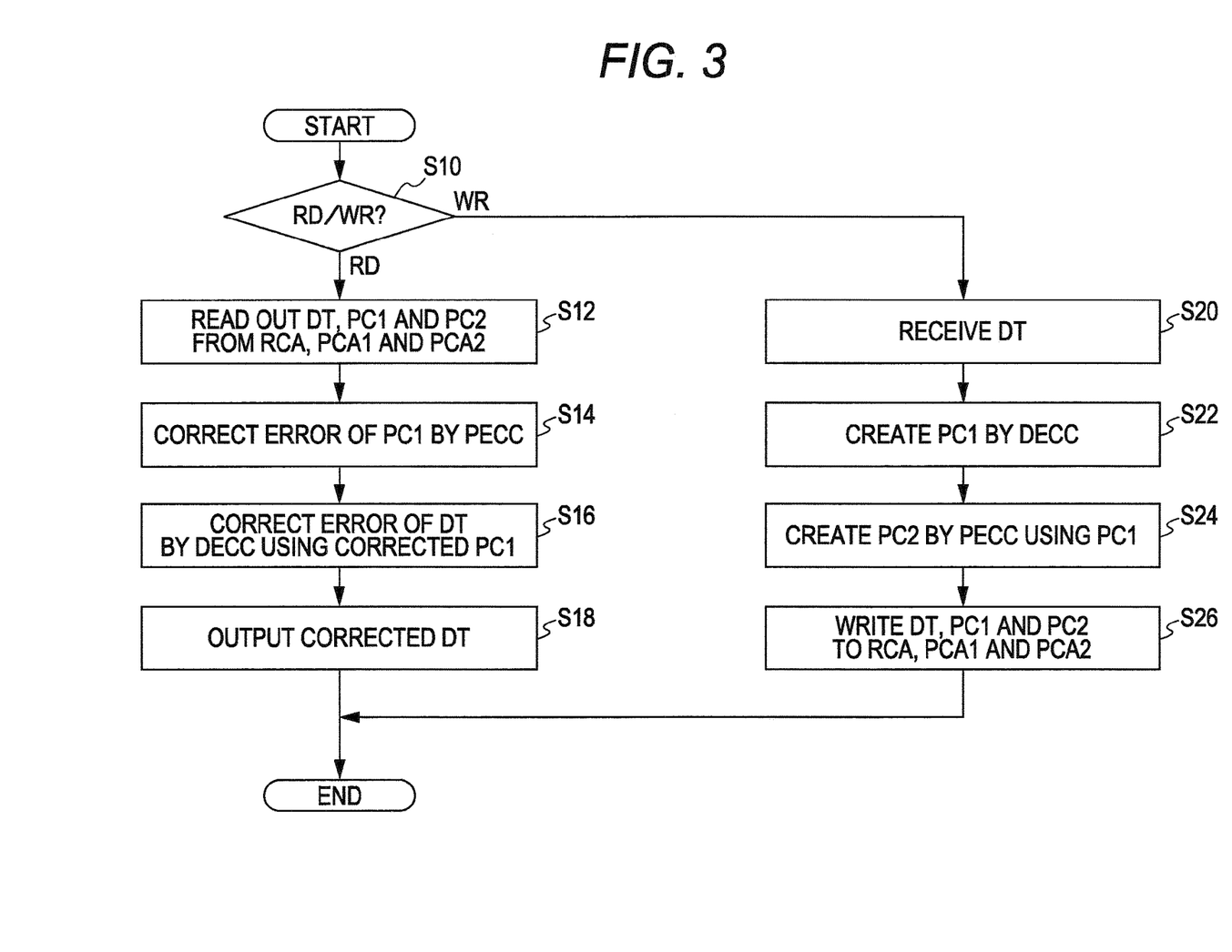
FIG. 3 shows an access operation of the first exemplary implementation, in accordance with aspects of the embodiment.

FIG. 3 shows an access operation of the first exemplary implementation, in accordance with aspects of the embodiment. FIG. 3 shows a flow of the internal operation of the memory. First, at operation S10, the memory determines whether the access request supplied to a command terminal is a read request RD or a write request WR. When the access request is the read request RD, a word line WL according to the address signal AD is selected at operation S12, and data is read out from the regular memory cell coupled to the selected word line WL and from the first and the second parity memory cells. That is, a read operation is performed to the memory core CORE. The regular data DT of 512 bits is read from the regular cell array RCA coupled to the common word line WL. The first parity code PC1 of 32 bits is read from the parity cell array PCA1 coupled to the common word line WL. The second parity code PC2 of 6 bits is read from the parity cell array PCA2 coupled to the common word line WL.

Next, at operation S14, the parity error correction unit PECC detects and corrects the error of the first parity code PC1 based on the second parity code PC2. At operation S16, the data error correction units DECC detects and corrects the error of the regular data DT based on the corrected first parity code PC1. Note that when no error is detected at operation S14, that is, the first parity code PC1 has no error, the error correction of the first parity code PC1 is not made. The error of the regular data DT is detected and corrected using the first parity code PC1 read from the parity cell array PCA1.

At operation S18, the regular data DT whose error is corrected is output from a data output terminal DOUT to the outside of the memory MEM. The error of the regular data DT can be corrected each time an access is performed by holding the regular data DT, the first parity code PC1, and the second parity code PC2 to the memory cell coupled to one word line WL. As a result, the parity error correction unit and the data error correction unit need not have a buffer circuit and the like for temporarily holding data. That is, a defective remedy efficiency can be improved by minimizing memory area.

In contrast, when the access request is the write request WR, at operation S20, the data input/output circuit receives write data DT (regular data) supplied to the data input terminal. At operation S22, the data error correction unit generates the first parity code PC1 using the regular data DT. At operation S24, the parity error correction unit generates the second parity code PC2 using the first parity code PC1 generated by the data error correction units DECC. Then, at operation S26, the regular data DT, the first parity code PC1, and the second parity code PC2 are written to the regular memory cell, the first parity memory cell, and the second parity memory cell, which are coupled to the word line WL selected according to the address signal AD. That is, a write operation is performed to the memory core CORE so that the regular data DT of 512 bits, the first parity code PC1 of 32 bits, and the second parity code PC2 of 6 bits are written to the regular cell array RCA, the parity cell array PCA1, and the parity cell array PCA2, respectively.

In the first exemplary implementation, the parity code PC1 and the parity code PC2 are generated in the write operation by operating the four data error correction units and the one parity error correction unit, respectively. In the read operation, the error of the parity code PC1 and the error of the regular data DT are detected and corrected by operating the four data error correction units and the one parity error correction unit. In other words, the parity codes PC1 and PC2 are generated using the four arithmetic operations performed by the error correction unit, or the error of the parity code PC1 and the error of the regular data DT are detected and corrected using the four arithmetic operations performed by the error correction unit. As described above, in the first exemplary implementation, the scale of the arithmetic operation circuit for detecting an error is small, and the number of arithmetic operations are minimized. Since the number of the arithmetic operation is small, an error detection time and an error correction time are greatly reduced. In particular, since the number of bits treated by the parity error correction unit is 38 bits, the circuit scale of the parity error correction unit is small.

Note that, in a refresh operation, for example, operations S12 to S16 of the read operation flow excluding operation S18 are executed. Then, the corrected regular data DT and the corrected first parity code PC1 are written again to the memory cell. Note that, in the refresh operation, only the refresh operation of the memory core may be performed without operating the parity error correction unit and the data error correction units.

As the error correction method using the horizontal/vertical parity codes requires a parity arithmetic operation of each bit group arranged in a horizontal direction and a parity arithmetic operation of each bit group arranged in a vertical direction to detect data error. Accordingly, the scale of an arithmetic operation circuit and the number of arithmetic operations for detecting an error are increased, and an error detection time and an error correction time are increased.

However, in the first exemplary implementation, as the error of the first parity code is corrected using the second parity code, the effective defect ratio of the first parity memory cell can be reduced. That is, even when regular data and a first parity code corresponding to the regular data have an error, respectively, the first exemplary implementation can correct the error of the regular data. Accordingly, the defect remedy efficiency can be improved. Further, since the second parity code is the parity code which is dedicated to the first parity code and common to all the bits of a plurality of first parity codes. Accordingly, the first exemplary implementation can generate the second parity code using a single arithmetic operation and can detect the error of the first parity code using a single arithmetic operation. As a result, the first exemplary implementation reduces the scale of the arithmetic operation circuit for detecting an error and minimizes the number of arithmetic operations. Then, the first exemplary implementation reduces the error detection time and the error correction time.

Further, the first exemplary implementation holds the regular data, the first parity code, and the second parity code to the memory cell coupled to the one word line. Accordingly, the first exemplary implementation can correct the error of the regulator data each time a single access is performed. As a result, the parity error correction unit and the data error correction units need not have the buffer circuit and the like for temporarily holding data. That is, the first exemplary implementation can improve the defect remedy efficiency by minimizing the semiconductor memory area.

Figure 4:
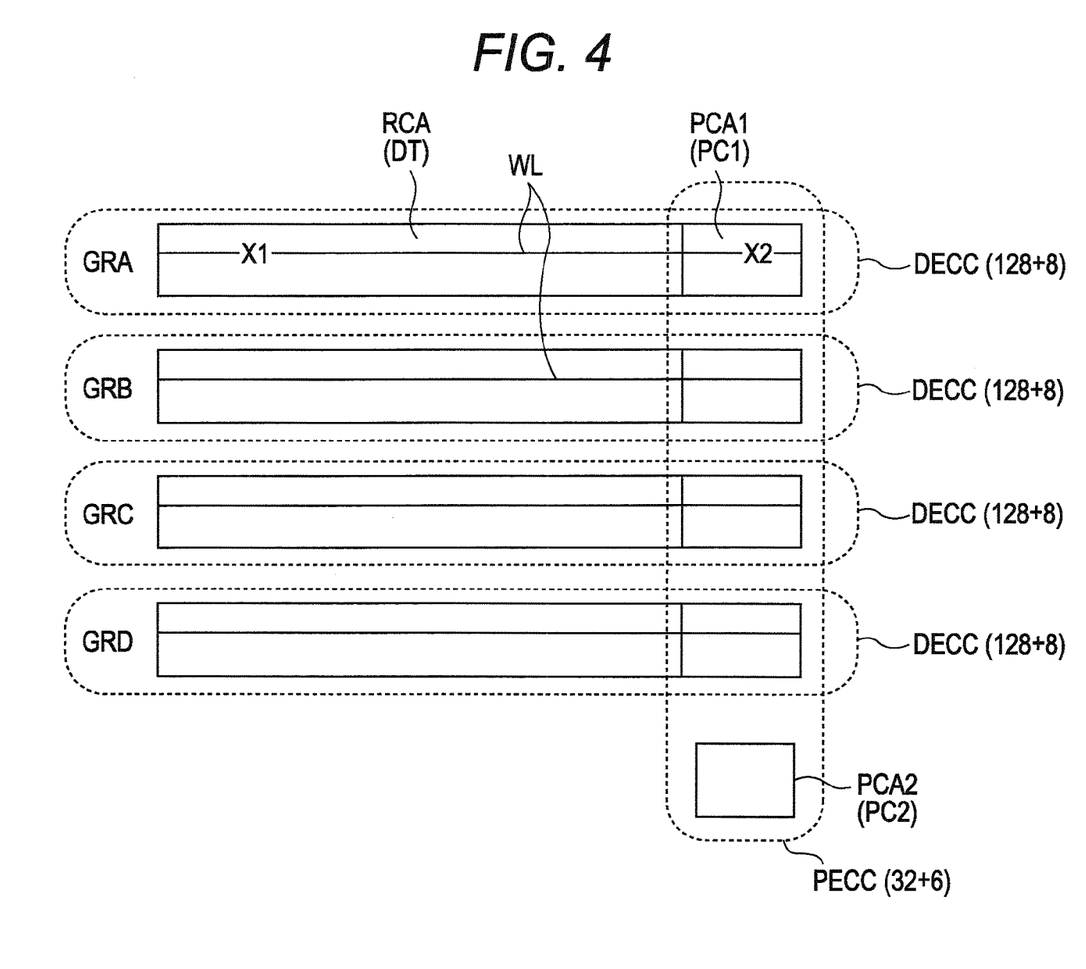
FIG. 4 shows an error correction operation of the first exemplary implementation, in accordance with aspects of the embodiment.

FIG. 4 shows an error correction operation of the first exemplary implementation, in accordance with aspects of the embodiment. Each data error correction unit DECC shown in FIG. 1 can correct the error of 1 bit of the regular data DT (128 bits) of each of the memory groups GRA, GRB, GRC, GRD using the first parity code PC1 of 8 bits.

Lateral lines in the memory group GRA to GRD show the common word lines WL. A symbol X1 shown on the lateral line shows a 1-bit error occurred to the regular memory cell coupled to the word line WL. A symbol X2 shows a 1-bit error occurred to the first parity memory cell coupled to the word line WL. When a 2-bit error has occurred in the memory group GRA, the data error correction units DECC cannot correct the 1-bit error X1. However, the 1-bit error (X2) of the first parity code PC1 of the memory group GRA to GRD can be corrected by the parity error correction unit PECC. Accordingly, the data error correction units DECC can correct the 1-bit error X1 of the regular cell array RCA of the memory group GRA using the corrected first parity code PC1. As described above, even if the regular data and the first parity code corresponding to the regular data have an error, respectively, the first exemplary implementation can correct the error of the regulator data.

The memory MEM of the first exemplary implementation has the parity cell array PCA2 for holding the dedicated second parity code PC2 for correcting the error of the first parity code PC1. The memory MEM can correct the error of the first parity code PC1 using the second parity code PC2, whereby the effective defect ratio of the first parity memory cell MC can be reduced. That is, the defect remedy efficiency of the memory MEM can be improved.

The second parity code PC2 is the code dedicated to the first parity code PC1 which includes bits common to all the bits of the four first parity codes PC1. Accordingly, the first exemplary implementation can generate the second parity code PC2 using the single arithmetic operation and can detect the error of the first parity code PC1 using the single arithmetic operation. Therefore, the first exemplary implementation reduces the scale of the arithmetic operation circuit for detecting an error and minimizes the number of arithmetic operations. Since the number of arithmetic operations is small, the error detection time and the error correction time can be reduced. As a result, the defect remedy efficiency can be improved by reducing the scale of the arithmetic operation circuit for detecting an error and minimizing the increase of the area thereof.

Figure 5:
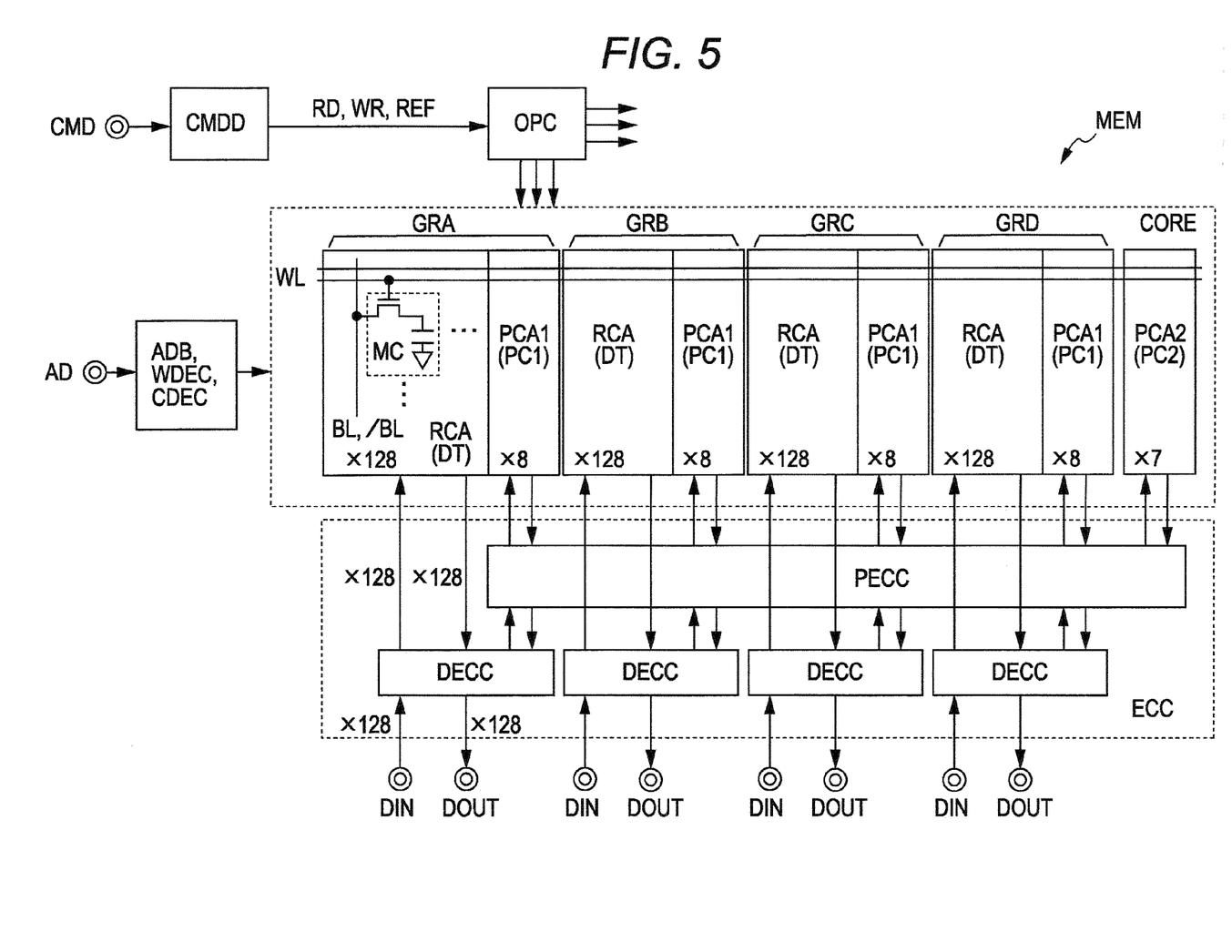
FIG. 5 shows a second exemplary implementation, in accordance with aspects of the embodiment.

FIG. 5 shows a second exemplary implementation, in accordance with aspects of the embodiment. The same components as those explained in the first exemplary implementation are denoted by the same reference numerals and the detailed explanation thereof is omitted. In the second exemplary implementation, a parity cell array PCA2 is composed of 7 bits. That is, in the parity cell array PCA2, seven (7) second parity memory cells are coupled to a common word line WL. The other arrangement of the second exemplary implementation is the same as that of the first embodiment except that a parity error correction unit PECC has a different logic. The parity error correction unit PECC detects and corrects an error using an expanded hamming code. The parity error correction unit PECC can detect the 2-bit error of a first parity code PC1 of 32 bits and can correct 1 bit-error thereof.

Figure 6:
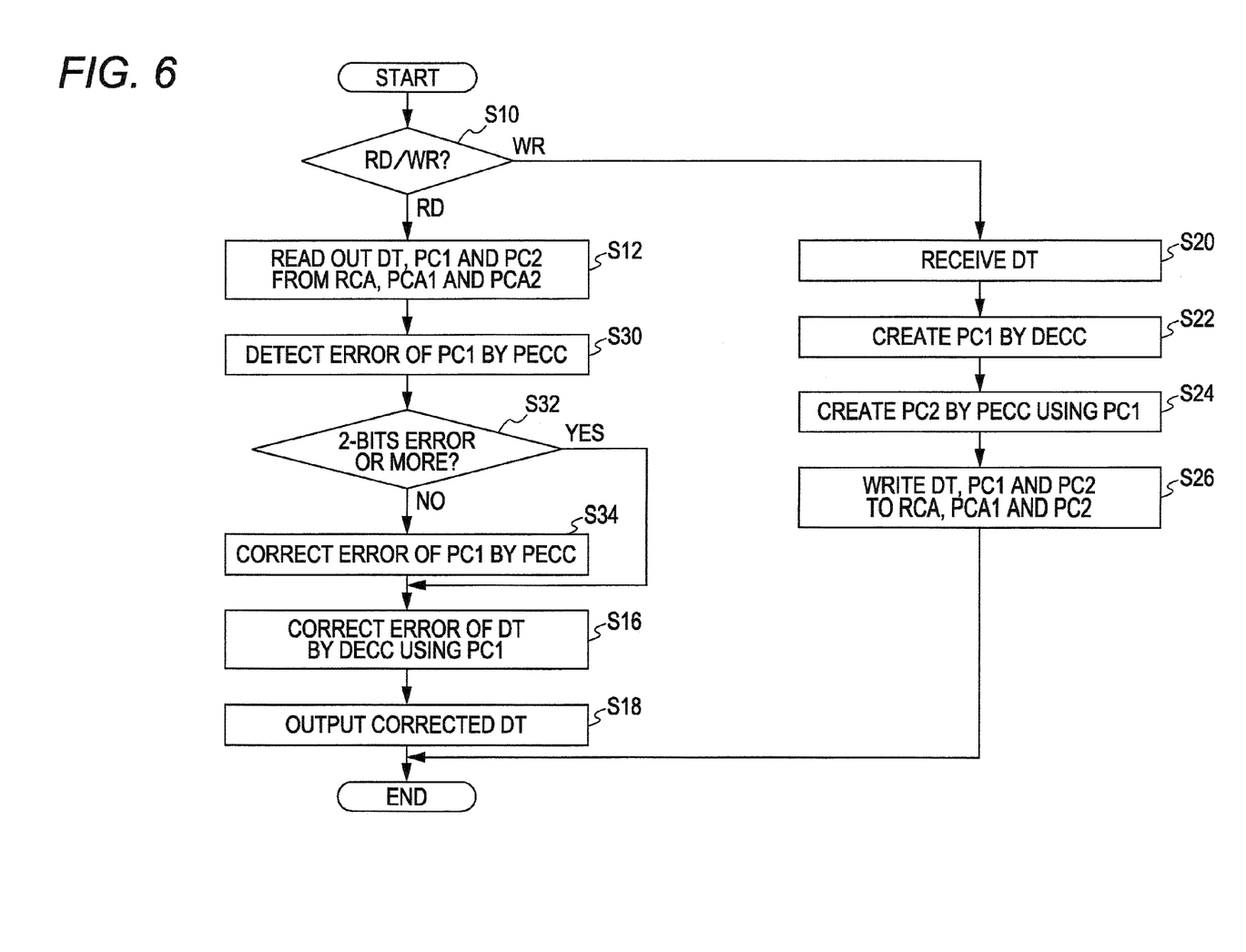
FIG. 6 shows an access operation of the second exemplary implementation, in accordance with aspects of the embodiment.

FIG. 6 shows an access operation of the second exemplary implementation. FIG. 3 shows an access operation of the first exemplary implementation. In FIG. 6, the same flows as those of the first exemplary implementation (FIG. 3) are denoted by the same reference numerals, and the detailed explanation thereof is omitted. In the second exemplary implementation, operations S30, S32, and S34 are added in place of operation S14 of FIG. 3. The other flows of FIG. 6 are the same as those of FIG. 3.

First, at operation S30, the parity error correction unit PECC detects the error of the first parity code PC1 based on a second parity code PC2. Next, at operation S32, the error correction unit ECC determines whether or not a 2-bit error is detected by the parity error correction unit PECC. When the 2-bit error is detected, the flow goes to operation S16. When the 2-bit error is not detected, that is, when a 1-bit error is detected, at operation S34, the parity error correction unit PECC corrects the 1-bit error of the first parity code PC1 based on the second parity code PC2. Note that when no error is detected at operation S30, respective data error correction units DECC detects and corrects the error of regular data DT using the first parity code PC1 read from a parity cell array PCA1 at operation S16.

Figure 7:
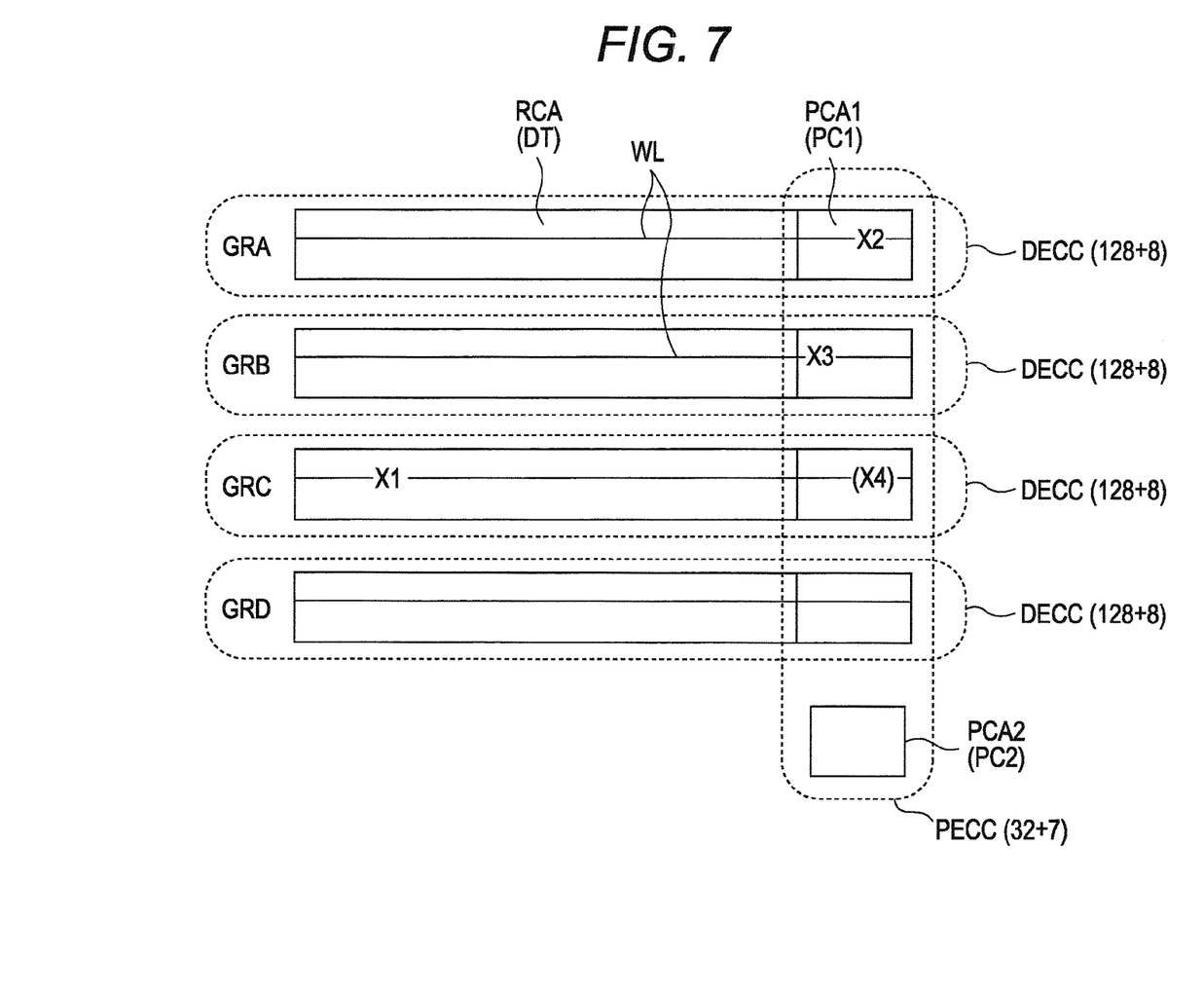
FIG. 7 shows an error correction operation of the second exemplary implementation, in accordance with aspects of the embodiment.

FIG. 7 shows an error correction operation of the second exemplary implementation, in accordance with aspects of the embodiment. The detailed explanation of the operations of the second exemplary implementation which are the same as those of the first exemplary implementation (FIG. 4) is omitted. In the second exemplary implementation, a 1-bit error X1 has occurred to the regular data DT of a memory group GRC. Further, 1-bit errors X2, X3 have occurred to the first parity codes PC1 of memory groups GRA and GRB, respectively. When the parity error correction unit PECC detects the 2-bits error of the first parity code PC1, it does not correct the error and outputs the first parity code PC1 read from the parity cell array PCA1 to the data error correction units DECC. The error X1 is corrected by the data error correction unit DECC corresponding to the memory group GRC. Then, read data corresponding to the memory groups GRA to GRD is output from a data output terminal DOUT.

In contrast, when the expanded hamming code is not employed, the parity error correction unit PECC cannot detect the 2-bits error. At the time, for example, the parity error correction unit PECC performs an abnormal error correction and detects that the bit X4 of the first parity code PC1 of the memory group GRC has an error. At the time, since the logic of the bit X4 is inverted, the error of the bit X1 cannot be corrected.

As described above, the second exemplary implementation can obtain the same advantage as that of the first embodiment. Further, the second exemplary implementation uses the second parity code PC2 which can detect the 2-bits error of the first parity code PC1. With this arrangement, even when a 2-bit error has occurred to the first parity code PC1, the second exemplary implementation enables the 1-bit error of the regular data DT to be corrected. Further, the second exemplary implementation can prevent the regular data DT having no error from being corrected by the 2-bit error of the first parity code PC1. Since the second exemplary implementation can detect the 2-bit error of the first parity code PC1 by increasing 1 bit to the second parity code PC2, the second exemplary implementation can improve the defect remedy efficiency by minimizing an increase of the area of the memory core CORE.

When the parity error correction unit detects that the first parity code has a 2-bit error, it outputs the first parity code read from the first parity memory cell to the data error correction unit without correcting it. The data error correction unit corrects the data read from a regular memory cell using the first parity code read from the first parity memory cell. As described above, when the 2-bit error has occurred to the first parity code, a disadvantage wherein the error of regulator data having a 1-bit error is not corrected can be prevented. Further, the regular data without error is not corrected.

Figure 8:
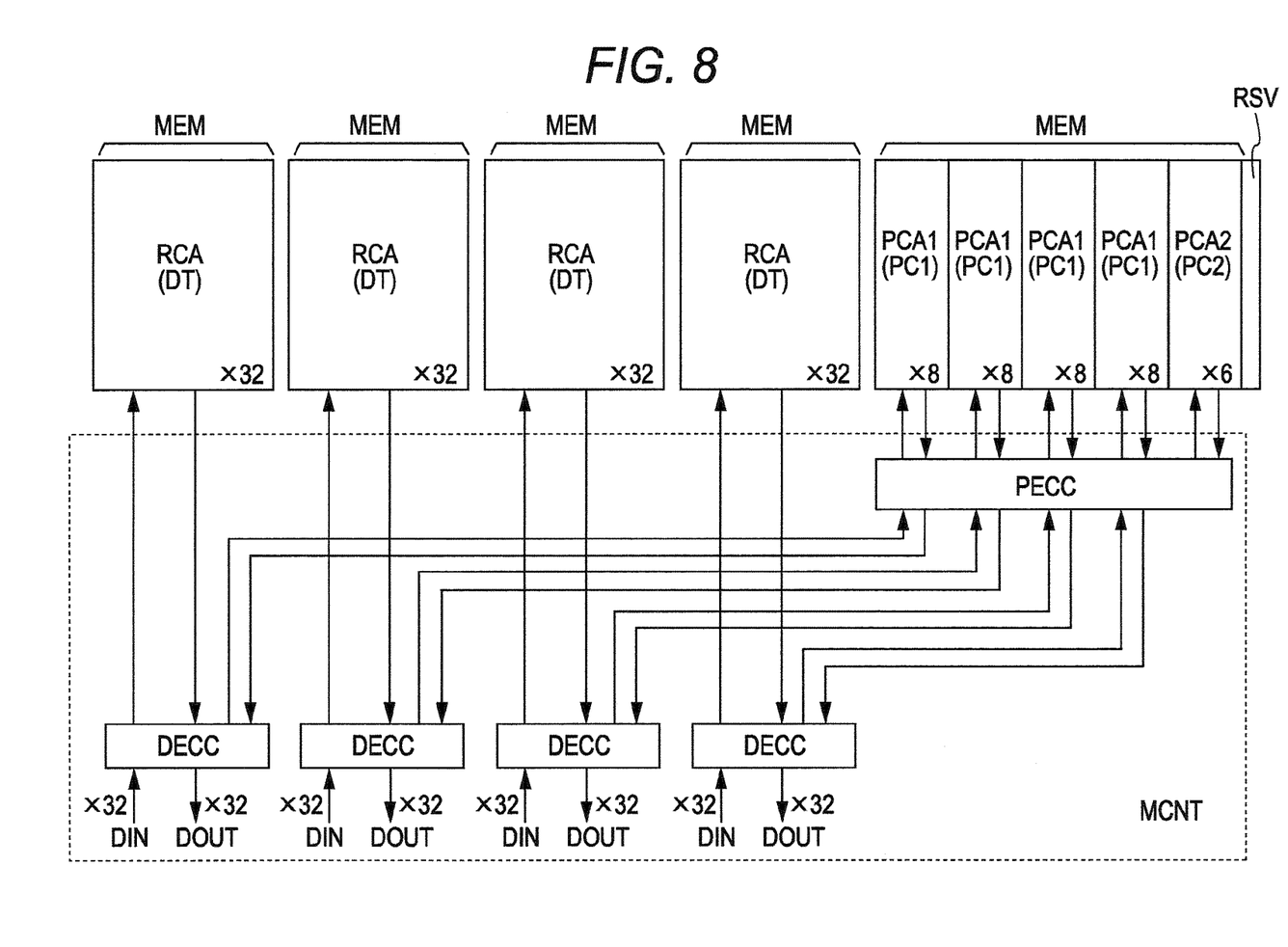
FIG. 8 shows a third exemplary implementation, in accordance with aspects of the embodiment.

FIG. 8 shows a third exemplary implementation, in accordance with aspects of the embodiment. In the third exemplary implementation, the same components as those of the first exemplary implementation are denoted by the same reference numerals and the detailed explanation thereof is omitted. A system SYS of the third exemplary implementation includes five semiconductor memories MEM and a memory controller MCNT for controlling the operations of the semiconductor memories MEM. The memories MEM are, for example, DRAM chips. Each of the memories MEM is composed of the same chip having the same memory capacity and 32-bits data terminal. In the five memories MEM, four memories MEM store regular data DT of 32 bits by a single write operation, respectively. The remaining one memory MEM stores a first parity code PC1 (8 bits) for correcting the errors of respective regular data DT and a second parity code PC2 (6 bits) for correcting the errors of four first parity codes PC1 by a single write operation. The memory MEM for storing the parity codes PC1, PC2 has a 2-bit reserve region RSV. As described above, each of a plurality of memory blocks for holding the regular data DT of the third exemplary implementation are composed on one chip. Further, each of first and second parity blocks for holding the first parity codes PC1 and the second parity code PC2 is composed on one chip.

The memory controller MCNT is composed on one chip. The memory controller MCNT includes a parity error correction unit PECC common to four parity cell arrays PCA1 and four data error correction units DECC corresponding to the four memories MEM for holding the regular data DT. The functions of the parity error correction unit PECC and the data error correction units DECC are the same as those of the parity error correction unit PECC and the data error correction units DECC of the first exemplary implementation except for the number of bits to be processed thereby. That is, each of the parity error correction unit PECC and the data error correction units DECC of the third exemplary implementation is composed of a logic circuit (hardware). Note that when there is a plenty of time for an error detection and a error correction, the parity error correction unit PECC and the data error correction units DECC may be realized by software. The memory controller MCNT outputs regular data DT of 128 bits by a single read operation and inputs regular data DT of 128 bits by a single write operation.

Figure 9:
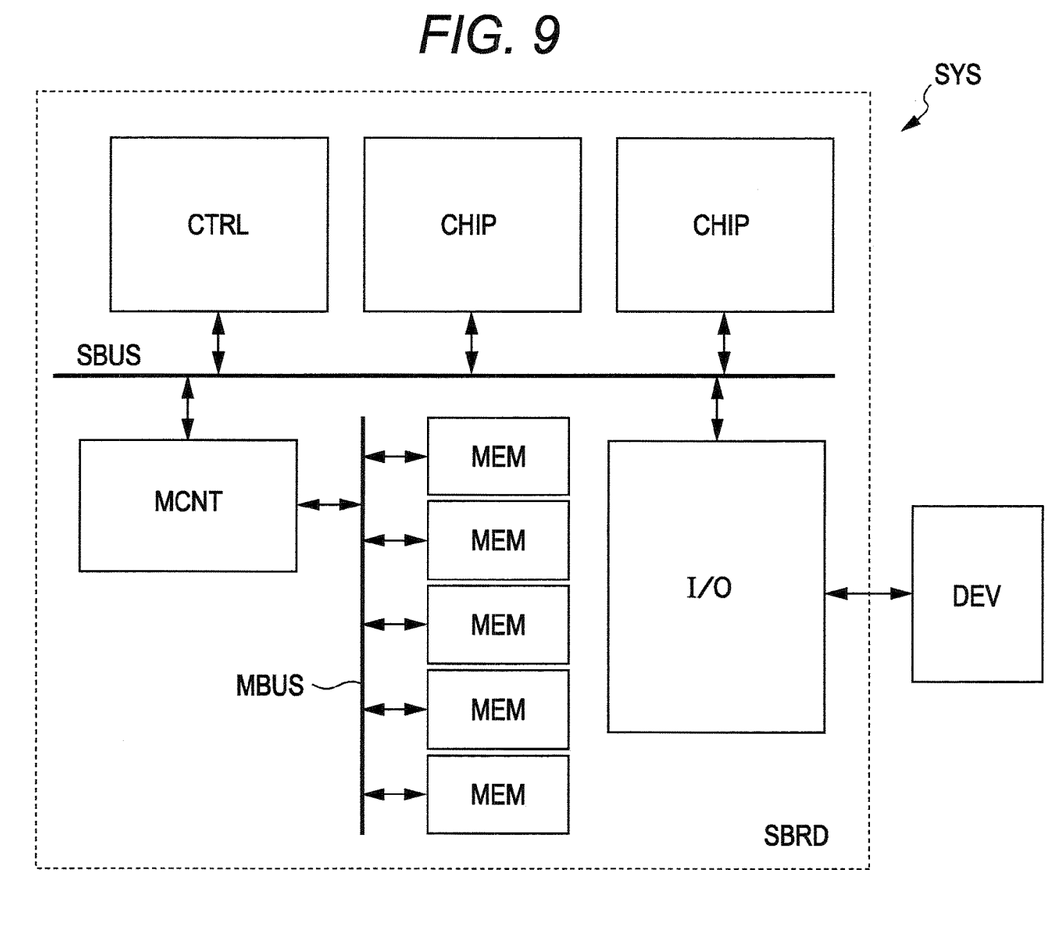
FIG. 9 shows a system block view including a memory and a memory controller of the third exemplary implementation, in accordance with aspects of the embodiment.

FIG. 9 shows the system SYS on which the memories MEM and the memory controller MCNT shown in FIG. 8 are mounted. Explanation of the same arrangements of the system SYS of the third exemplary implementation as those of the first exemplary implementation (FIG. 2) is omitted. The system SYS is, for example, mobile equipment such as a digital camera and the like. The system SYS is mounted on a system board SBRD and includes a controller chip CTRL, a plurality of semiconductor chips CHIP, a memory controller chip MCNT, five memory chips MEM, and an external interface unit I/O of the system board SBRD, which are connected to each other by a system bus SBUS, and a peripheral device DEV connected to the external interface unit I/O. The controller chip CTRL is, for example, a CPU, and the semiconductor chips CHIP are, for example, DMACs, image processing controllers, and the like. The peripheral device DEV is, for example, a liquid crystal display, a speaker, an input device, and the like. Note that a non-volatile semiconductor memory such as a flash memory and the like is mounted on the system board SBRD to store a program executed by the CPU.

The memory controller MCNT receives a read-out request from the controller CTRL through the system bus SBUS. The memory controller MCNT performs a read-out access to the four memories MEM and receives the regular data of 128 bits from the four memories MEM each time the read-out operation is performed. The memory controller MCNT receives a write request from the controller CTRL through the system bus SBUS. The memory controller MCNT performs a write access to the memories MEM and writes regular data of 128 bits to the memories MEM each time the write operation is performed. The unit of data, which the memory controller MCNT inputs to and outputs from the system bus SBUS, may be 128 bits, 32 bits, or 256 bits.

As described above, the third exemplary implementation can obtain the same advantage as that of the first exemplary implementation. Further, when the system SYS is arranged using the plurality of memories MEM, the third exemplary implementation can improve the defect remedy efficiency similar to the first exemplary implementation by collectively storing the first parity codes PC1 and the second parity code PC2 to one chip memory MEM. In particular, since the memories MEM, to which the parity codes PC1 and parity code PC2 are stored, are the same as the memory MEM to which the regular data DT is stored, the layout and the timing of the system board SBRD can be easily designed. That is, a design cost can be reduced. Note that when the five memories MEM are composed of a plurality of laminated memory chips (multi-chip package), the area of the system board SBRD can be reduced and thus a system cost can be reduced.

Note that although these exemplary implementations are applied to DRAM, they are not limited to DRAM. The exemplary implementations and/or variations may be applied to, for example, semiconductor memories such as FCRAM (Fast Cycle RAM), SRAM, a dielectric memory, and the like. FCRAM is a pseudo-SRAM having a DRAM memory cell and an SRAM interface. FCRAM has a refresh timer for automatically performing a refresh operation, a refresh address counter, an arbiter for determining the priority order of external access requests RD, WR and an internal refresh request, and the like.

The exemplary implementations and/or variations can be applied to a semiconductor memory and a system having an error correction function.

Example exemplary implementations and/or variations, in accordance with aspects of the present invention have now been described in accordance with the above advantages. It will be appreciated that these examples are merely illustrative of the invention. Many variations and modifications will be apparent to those skilled in the art.

In addition, the plurality of exemplary implementations and/or variations described above have no order of priority.

What is claimed is:

1. A semiconductor memory comprising;
    a plurality of memory blocks that includes a plurality of regular memory cells;
    a plurality of first parity blocks that are disposed in accordance with the plurality of memory blocks, wherein the plurality of first parity blocks include a first parity memory cell holding a first parity code;
    a second parity block that includes a second parity memory cell holding a second parity code having a parity bit corresponding to the first parity code;
    a parity error correction unit that corrects an error of the first parity code using the second parity code; and
    a data error correction unit that corrects an error of the data stored in a regular memory cell using the first parity code corrected by the parity error correction unit.

2. The semiconductor memory according to claim 1, wherein the second parity code includes bits common to all the bits of the first parity code accessed.

3. The semiconductor memory according to claim 1, comprising:
    a word line that is common to the plurality of memory blocks, the plurality of first parity blocks, and the second parity block,
    wherein the parity error correction unit corrects the first parity code read from a first parity memory cell coupled to the word line using the second parity code read from a second parity memory cell coupled to the word line.

4. The semiconductor memory according to claim 3, wherein the data error correction unit corrects the data read from the regular memory cell coupled to the word line using the first parity code corrected by the parity error correction unit.

5. The semiconductor memory according to claim 1, wherein when the parity error correction unit detects that the first parity code has a 2-bit error, the parity error correction unit outputs the first parity code read from the first parity memory cell to the data error correction unit without correcting it.

6. The semiconductor memory according to claim 5, wherein the data error correction unit corrects the data read from the regular memory cell using the first parity code read from the first parity memory cell.

7. The semiconductor memory according to claim 1, wherein the data error correction unit generates a first parity code based on write data, and wherein the parity error correction unit generate a second parity code based on the first parity code.

8. The semiconductor memory according to claim 1, wherein the parity error correction unit is disposed in common to the plurality of memory blocks, and wherein the data error correction unit is disposed in correspondence with each of the plurality of memory blocks.

9. The semiconductor memory according to claim 1, wherein the parity error correction unit is coupled to the first parity block and the second parity block, and wherein the data error correction unit is coupled to each of the plurality of memory blocks and the parity error correction unit.

10. An error correction method of a semiconductor memory comprising:
    selecting a word line common to a plurality of memory blocks, a first parity block, and a second parity block in response to a read request;
    reading a first parity code from a first parity memory cell coupled to the word line in the first parity block;
    reading a second parity code from a second parity memory cell coupled to the word line in the second parity block;
    correcting the first parity code using the second parity code; and
    correcting the data held by a regular memory cell in the memory block using the corrected first parity memory cell code.

11. The error correction method of the semiconductor memory according to claim 10, wherein the second parity code includes bits common to all the bits of the first parity code.

12. The error correction method of the semiconductor memory according to claim 10, wherein when it is detected that the first parity code has a 2-bit error, the data read from the regular memory cell is corrected using the first parity code read from the first parity memory cell that is not corrected.

13. The error correction method of the semiconductor memory according to claim 10 comprising:
    writing data to the regular memory cell in the memory blocks;
    generating a first parity code based on the data and writing the first parity code to a first parity memory cell; and
    generating a second parity code based on the first parity code and writing the second parity code to a second parity memory cell.

14. A semiconductor memory system comprising;
    a semiconductor memory; and
    a controller that controls access to the semiconductor memory,
    wherein the semiconductor memory comprises:
        a plurality of memory blocks that include a plurality of regular memory cells;
        a plurality of first parity blocks that are disposed in correspondence with the plurality of memory blocks, wherein the plurality of first parity blocks include a first parity memory cell holding a first parity code;
        a second parity block that includes a second parity memory cell for holding a second parity code having a parity bit corresponding to the first parity code;
        a parity error correction unit that corrects an error of the first parity code using the second parity code; and
        a data error correction unit that corrects an error of the data stored in a regular memory cell using the first parity code corrected by the parity error correction unit.

15. The semiconductor memory system according to claim 14, wherein the second parity code includes bits common to all the bits of the first accessed parity code.

16. The semiconductor memory system according to claim 14, wherein the controller supplies an access request signal or an address signal to the semiconductor memory.

17. The semiconductor memory system according to claim 14, wherein the parity error correction unit is disposed in common to the plurality of memory blocks, and wherein the data error correction unit is disposed in correspondence with each of the plurality of memory blocks.

18. The semiconductor memory system according to claim 14, wherein each of the memory blocks, the first parity block, the second parity block, the parity error correction unit, and the data error correction unit are comprised on one chip.

19. The semiconductor memory system according to claim 14, wherein each of the memory blocks is comprised on one chip, wherein the first parity block and the second parity block is comprised on one chip, and wherein the parity error correction unit and the data error correction unit are comprised on one chip.

20. The semiconductor memory system according to claim 14, wherein the chip including each of the memory blocks and the chip including the first parity block and the second parity block have the same storage capacity and the same number of data terminals.

* * * * *